US008829563B2

(12) United States Patent
Rahimo et al.

(10) Patent No.: US 8,829,563 B2
(45) Date of Patent: Sep. 9, 2014

(54) POWER SEMICONDUCTOR DEVICE AND METHOD FOR MANUFACTURING SUCH A POWER SEMICONDUCTOR DEVICE

(71) Applicant: ABB Technology AG, Zurich (CH)

(72) Inventors: Munaf Rahimo, Uezwil (CH); Marco Bellini, Schlieren (CH); Maxi Andenna, Dättwil (CH); Friedhelm Bauer, Semione (CH); Iulian Nistor, Niederweningen (CH)

(73) Assignee: ABB Technology AG, Zurich (CH)

( * ) Notice: Subject to any disclaimer, the term of this patent is extended or adjusted under 35 U.S.C. 154(b) by 0 days.

(21) Appl. No.: 13/974,178

(22) Filed: Aug. 23, 2013

(65) Prior Publication Data

US 2013/0334566 A1 Dec. 19, 2013

Related U.S. Application Data

(63) Continuation of application No. PCT/EP2012/052986, filed on Feb. 22, 2012.

(30) Foreign Application Priority Data

Feb. 23, 2011 (EP) ..................... 11155572

(51) Int. Cl.
*H01L 29/66* (2006.01)
*H01L 29/08* (2006.01)
(52) U.S. Cl.
CPC .................................. *H01L 29/0813* (2013.01)
USPC .......................................... 257/139; 257/591
(58) Field of Classification Search
CPC .................. H10L 29/0804; H01L 29/0813
USPC .................................................. 257/139, 591
See application file for complete search history.

(56) References Cited

U.S. PATENT DOCUMENTS

| 6,037,632 | A | 3/2000 | Omura et al. |
| 6,147,381 | A | 11/2000 | Hirler et al. |
| 2006/0289928 | A1 | 12/2006 | Takaya et al. |
| 2008/0258208 | A1 | 10/2008 | Hirler et al. |
| 2008/0283867 | A1 | 11/2008 | Mori et al. |

FOREIGN PATENT DOCUMENTS

WO    WO 2005/036650 A2    4/2005

OTHER PUBLICATIONS

Notification Concerning Transmittal of International Preliminary Report on Patentability (Forms PCT/IB/326 and PCT/IB/373) and the Written Opinion of the International Searching Authority (Form PCT/ISA/237) issued on Sep. 6, 2013, in the corresponding International Application No. PCT/EP2012/052986. (7 pages).
International Search Report (PCT/ISA/210) issued on Sep. 19, 2012, by the European Patent Office as the International Searching Authority for International Application No. PCT/EP2012/052986.
Written Opinion (PCT/ISA/237) issued on Sep. 19, 2012, by the European Patent Office as the International Searching Authority for International Application No. PCT/EP2012/052986.
European Search Report issued on Apr. 28, 2011.

*Primary Examiner* — William D Coleman
(74) *Attorney, Agent, or Firm* — Buchanan Ingersoll & Rooney PC

(57) ABSTRACT

An insulated gate bipolar device is disclosed which can include layers of different conductivity types between an emitter electrode on an emitter side and a collector electrode on a collector side in the following order: a source region of a first conductivity type, a base layer of a second conductivity type, which contacts the emitter electrode in a contact area, an enhancement layer of the first conductivity type, a floating compensation layer of the second conductivity type having a compensation layer thickness $t_p$, a drift layer of the first conductivity type having lower doping concentration than the enhancement layer and a collector layer of the second conductivity type.

20 Claims, 6 Drawing Sheets

POWER SEMICONDUCTOR DEVICE AND METHOD FOR MANUFACTURING SUCH A POWER SEMICONDUCTOR DEVICE

RELATED APPLICATION(S)

This application claims priority as a continuation application under 35 U.S.C. §120 to PCT/EP2012/052986, which was filed as an International Application on Feb. 22, 2012 designating the U.S., and which claims priority to European Application 11155572.8 filed in Europe on Feb. 23, 2011. The entire contents of these applications are hereby incorporated by reference in their entireties.

FIELD

The disclosure relates to the field of power electronics and more particularly to a power semiconductor device.

BACKGROUND INFORMATION

In FIGS. 1 and 3 a known insulated gate bipolar transistor (IGBT) 10 is shown, which includes an active cell with layers of different conductivity types in the following order between an emitter electrode 2 on an emitter side 22 and a collector electrode 25 on a collector side 27 opposite to the emitter side 22: an (n+) doped source region 3, a (p) doped base layer 4, which contacts the emitter electrode 25 in a contact area 24, an (n−) doped drift layer 5, an (n+) doped buffer layer 52 and a (p) doped collector layer 6. A gate electrode is arranged on the emitter side 22. In FIGS. 1 to 4 an IGBT with planar gate electrode 7 is shown, whereas in FIG. 5 a known IGBT is shown, which has a trench gate electrode 75.

FIGS. 2, 4 and 5 show another known IGBT, in which an (n) doped enhancement layer 8' is arranged between the base layer 4 and the drift layer 5. The enhancement layer 8' has a higher doping concentration than the drift layer 5.

Known enhancement layer doping concentrations have been limited to $1*10^{16}$ cm$^{-3}$ in order to prevent excessive electric fields and therefore degradation of the blocking performance.

As the carrier concentration near the active cell is enhanced by such an enhancement layer 8', such IGBTs with an enhancement layer 8' can be superior compared to known IGBTs having no enhancement layer in view of higher safe operating area (SOA) and low on-state losses.

FIG. 3 shows electrical properties and effects for a known IGBT without enhancement layer, and FIG. 4 such effects for a known device having an enhancement layer 8'. It is shown how an n-type enhancement layer 8' can improve the carrier spreading from the cell by creating a barrier and reducing the amount of holes that can reach the cathode (PNP hole drainage effect). This can improve the PIN effect, increase the plasma concentration and lower the on-state losses.

However, the electric field at the n-enhancement/p-base junction 8', 4 also increases. Practical enhancement layer doping concentrations have therefore been limited to $1*10^{16}$ cm$^{-3}$ to prevent excessive electric fields and therefore degradation of the blocking performance.

U.S. Pat. No. 6,147,381 A shows a known IGBT having a planar gate, which includes a (p) doped base layer, an (n+) doped enhancement layer below the base layer, as well as (n+) doped layers on both sides of the base layer, thus completely surrounding the base layer. A floating (p) layer is arranged below the enhancement layer. The (p) floating layer is heavily doped and completely covers the area below the contact area and extends laterally far beyond the contact area.

The floating layer forms a main blocking junction which shields the (p) base junction from high fields; i.e., to inhibit the course of the equipotential lines from reaching as far as the lower edge of the base layer. However, due to the main blocking junction, the charge has a restricted access from the channel in terms of spreading.

US 2008/258208 A1 shows an IGBT having a rather complex structure, in which field plates at source potential are arranged below a trench gate. (P) doped layers are arranged as bubbles below the rounded trench gate bottom. Within such a highly doped (p) bubble a small highly doped (n) bubble is arranged. The bubbles can be used to improve blocking, or to shield the field because the trench gate rounding results in high peak fields.

As the trench electrode/field plates are terminated within the enhancement layer, the electric field will be even higher due to the higher doping of the enhancement layer compared to an arrangement in which the trench gate is terminated within the drift layer. The (p) bubble is used in the device known from US 2008/258208 A1 to achieve the blocking. Due to the presence of the (p) bubbles, the highly doped enhancement layer can extend further in a direction of the drift layer for having lower on resistance.

SUMMARY

An insulated gate bipolar device with a gate electrode, the gate electrode being arranged on an emitter side, is disclosed, which device comprises: an active cell with layers of different conductivity types in an order between an emitter electrode on the emitter side and a collector electrode on a collector side opposite to the emitter side as follows:

a source region of a first conductivity type;

a base layer of a second conductivity type, which contacts the emitter electrode in a contact area;

an enhancement layer of the first conductivity type having high doping concentration;

a compensation layer of the second conductivity type arranged between the enhancement layer and a drift layer, which has a compensation layer thickness $t_p$, which is a maximum thickness of the compensation layer in a plane perpendicular to the emitter side;

the drift layer of the first conductivity type having lower doping concentration than the enhancement layer, wherein the enhancement layer separates the base layer from the drift layer; and a collector layer of the second conductivity type;

wherein the compensation layer is arranged in a projection of the contact area between the enhancement layer and the drift layer, such that a channel between the enhancement layer and the drift layer is maintained; wherein the compensation layer floats relative to the base layer such that the compensation layer does not extend into an area outside the projection of the contact area; and wherein the enhancement layer has an enhancement layer thickness $t_n$, which is measured in a same plane as the compensation layer thickness, with:

$$N_p t_p = k N_n t_n,$$

wherein $N_n$ is a doping concentration of the enhancement layer; wherein $N_p$ is the doping concentration of the compensation layer; and wherein k is a factor between 0.67 and 1.5.

BRIEF DESCRIPTION OF THE DRAWINGS

The subject matter of the disclosure will be explained in more detail in the following text with reference to the attached drawings, in which.

Figure 1:
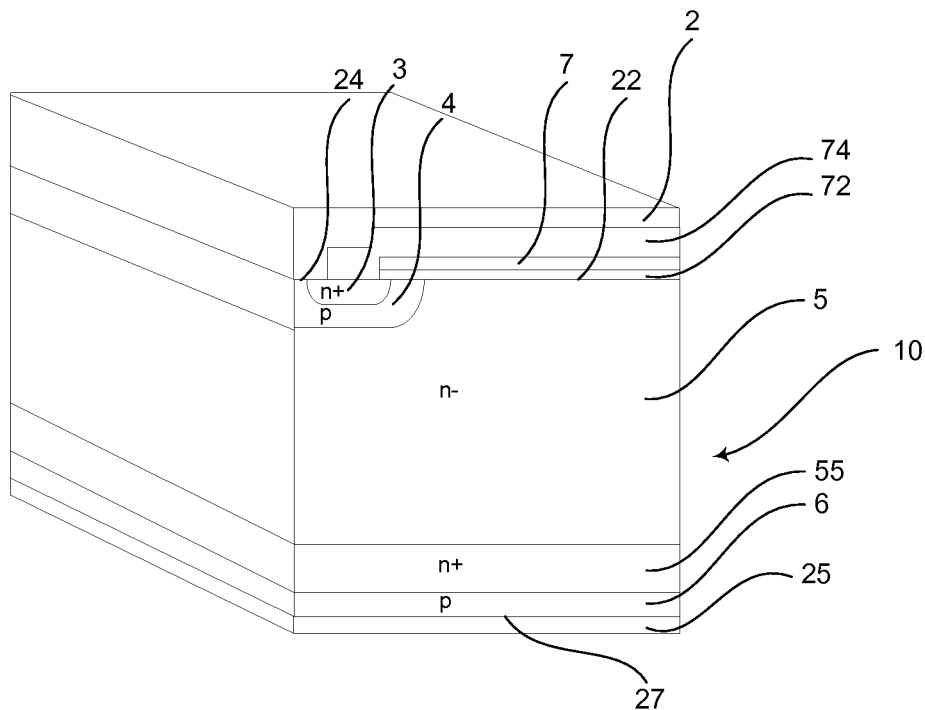
FIG. 1 shows a known insulated gate semiconductor device having a planar gate electrode.
Figure 2:
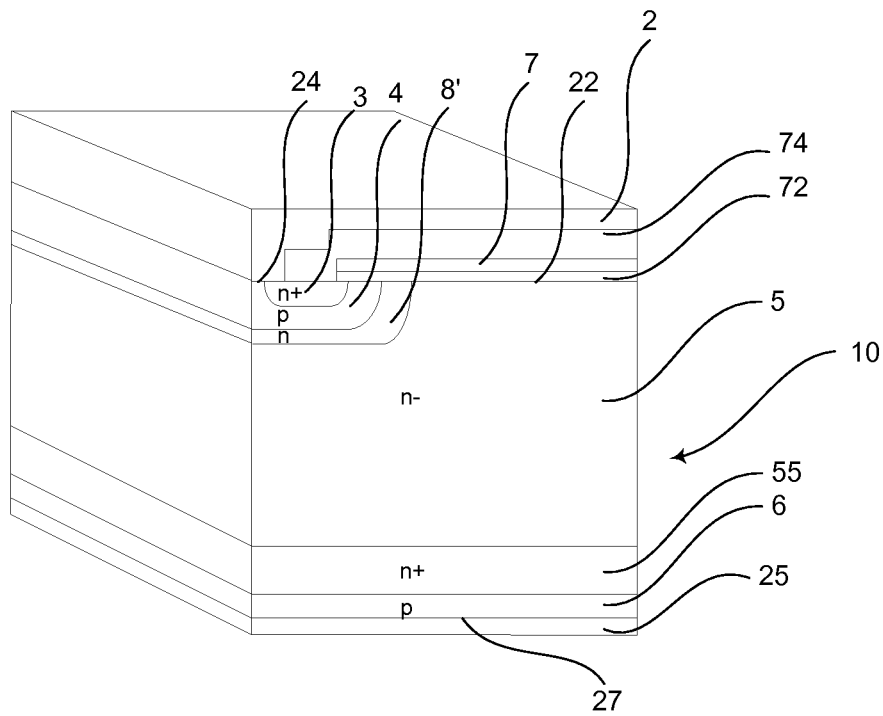
FIG. 2 shows another known insulated gate semiconductor device having an enhancement layer and planar gate electrode.
Figure 3:
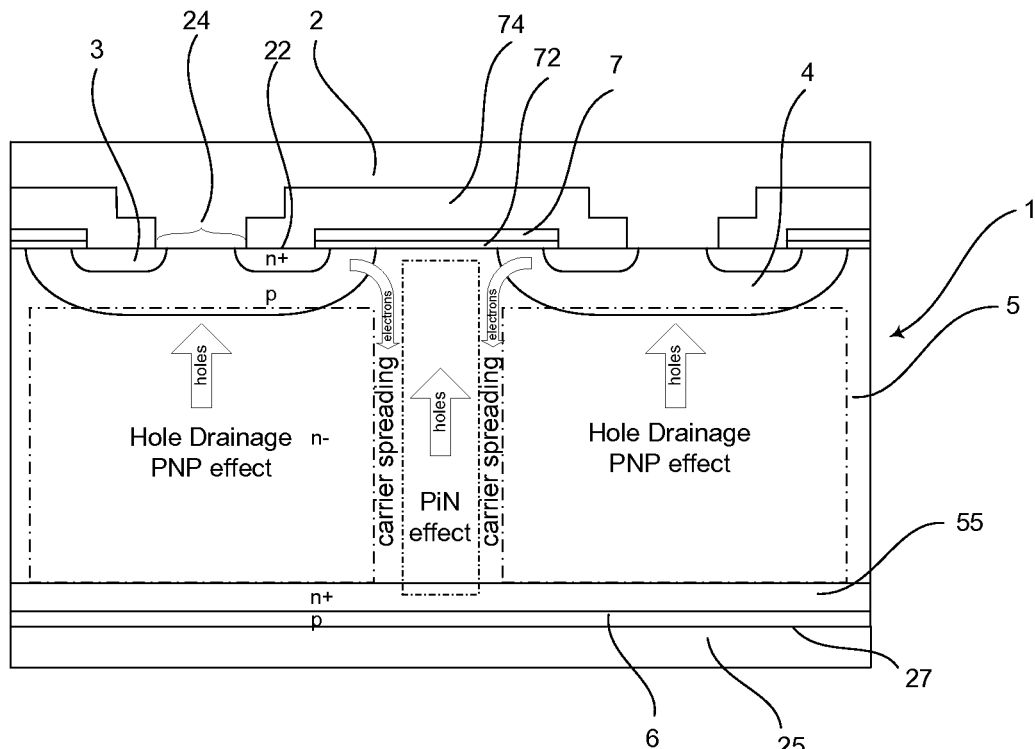
FIG. 3 shows electrical effects in an insulated gate semiconductor device according to FIG. 1.

The reference symbols used in the figures and their meaning are summarized in the list of reference symbols. Generally, alike or alike-functioning parts are given the same reference symbols. The described exemplary embodiments are meant as examples and are not intended to limit the present disclosure.

DETAILED DESCRIPTION

An exemplary power semiconductor device is disclosed in which on-state losses can be reduced compared to known devices.

An exemplary inventive power semiconductor device includes an active cell having layers of different conductivity types in the following order between an emitter electrode on an emitter side and a collector electrode on a collector side opposite to the emitter side: a source region of a first conductivity type; a base layer of a second conductivity type, which contacts the emitter electrode in a contact area; an enhancement layer of the first conductivity type having high doping concentration, which separates the base layer from a drift layer; a drift layer of the first conductivity type having lower doping concentration than the enhancement layer; and a collector layer of the second conductivity type. A gate electrode is arranged on the emitter side.

An exemplary compensation layer of the second conductivity type can be arranged between the enhancement layer and the drift layer, which has a compensation layer thickness $t_p$. The compensation layer thickness can have a maximum thickness of the compensation layer in a plane perpendicular to the emitter side. The compensation layer can be arranged in a projection of the contact area between the enhancement layer and the drift layer, such that a channel between the enhancement layer and the drift layer is maintained. The compensation layer can be restricted to an area inside the projection of the contact area. The compensation layer can be floating (e.g., not connected to the base layer).

The enhancement layer can have an enhancement layer thickness $t_{ni}$, which is the maximum thickness of the enhancement layer within the projection of the central area. Exemplary embodiments can be configured such that:

$$N_p t_p = k N_n t_n$$

wherein $N_p$ is a doping concentration of the enhancement layer;

wherein $N_p$ is the doping concentration of the compensation layer;

k is a factor between, for example, 0.67 and 1.5.

The compensation layer is introduced to compensate the doping of the enhancement layer. This allows an increase in the doping concentration in the enhancement layer.

In an exemplary embodiment the enhancement layer has a doping concentration higher than $1*10^{16}$ cm$^{-3}$, and in a further exemplary embodiment even higher than $2*10^{16}$ cm$^{-3}$. This can result in a more effective barrier, which blocks the hole flow into the emitter, thereby increasing the plasma concentration and reducing on-state losses.

Due to the inventive compensation layer, lower electric fields can occur even when very high enhancement layer concentrations are used, which doping concentrations are for example higher than those used in known devices.

The compensation layer is not connected to the base layer; e.g., it is a floating layer. That means that the compensation layer does not create a conductive path to the emitter electrode via the base layer, by which path holes would be enabled to reach the emitter electrode. Thereby, the on-state voltage of the device is reduced while keeping the same or even a higher breakdown voltage.

The compensation layer can be arranged adjacent to the enhancement layer so that the overall electric field decreases and blocking performance is maintained.

Figure 9:
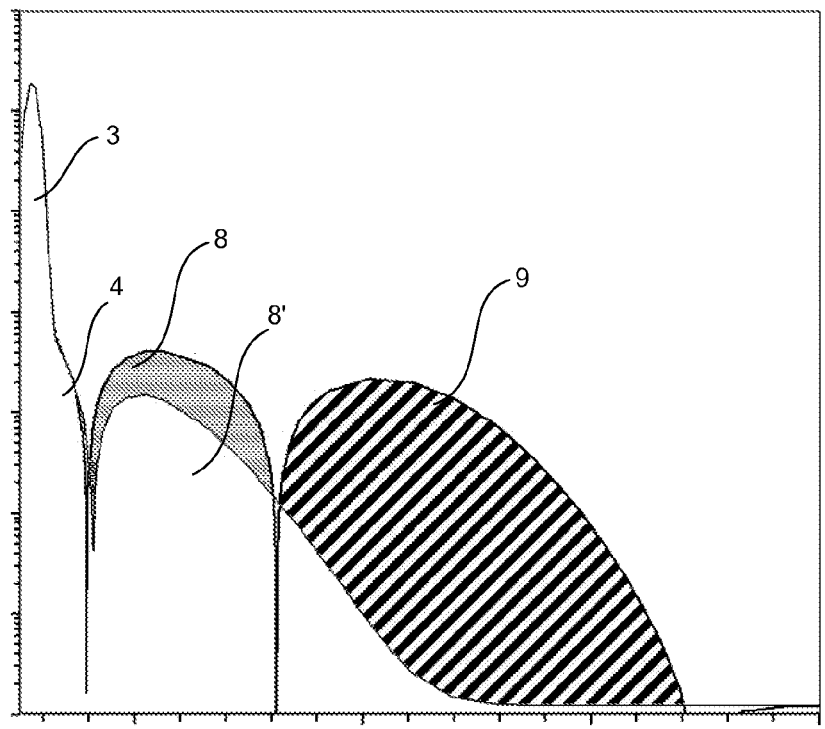
FIG. 9 shows doping concentrations of a known IGBT and an inventive IGBT according to an exemplary embodiment of the present disclosure.

FIG. 9 shows how the compensated structure can provide an ability to increase the doping concentration of the n-type enhancement layer 8 of an inventive device compared to a known enhancement layer 8'. The marked area shows the exemplary increase in doping concentration that can be achieved by the doping of the compensation layer. Furthermore, the doping concentration of the compensation layer 9 is shown in the FIG. 9.

Figure 5:
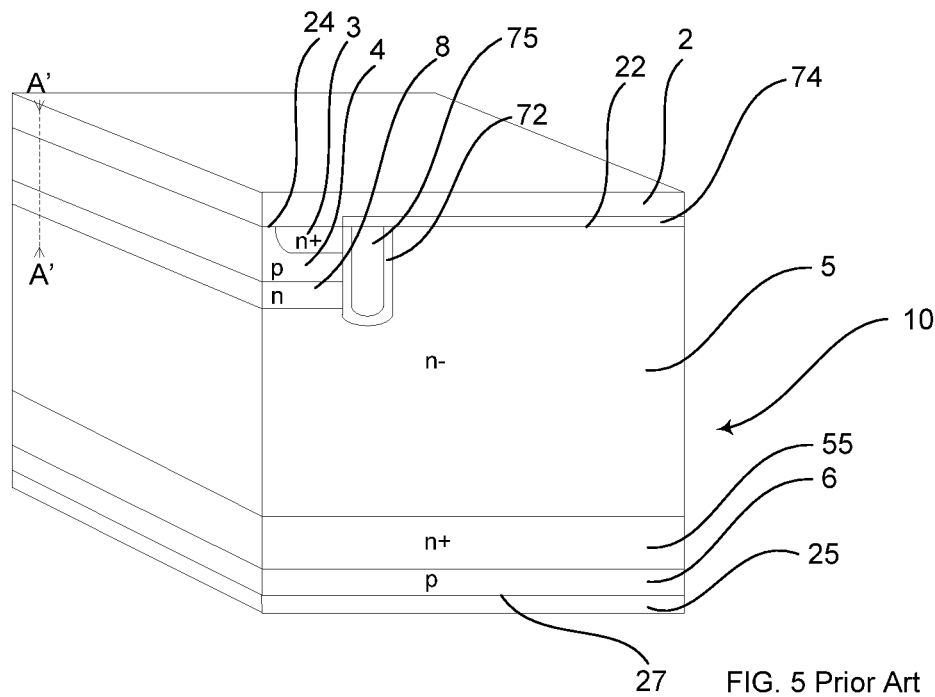
FIG. 5 shows another known insulated gate semiconductor device having an enhancement layer and trench gate electrode.
Figure 6:
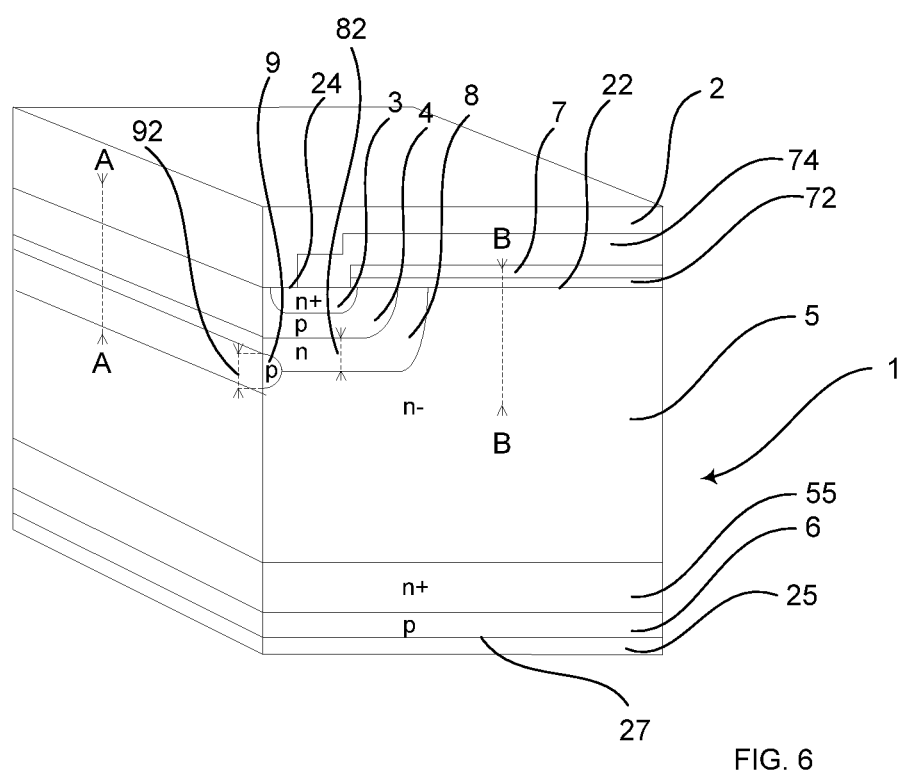
FIG. 6 shows an inventive insulated gate semiconductor device having a planar gate electrode according to an exemplary embodiment of the present disclosure.
Figure 7:
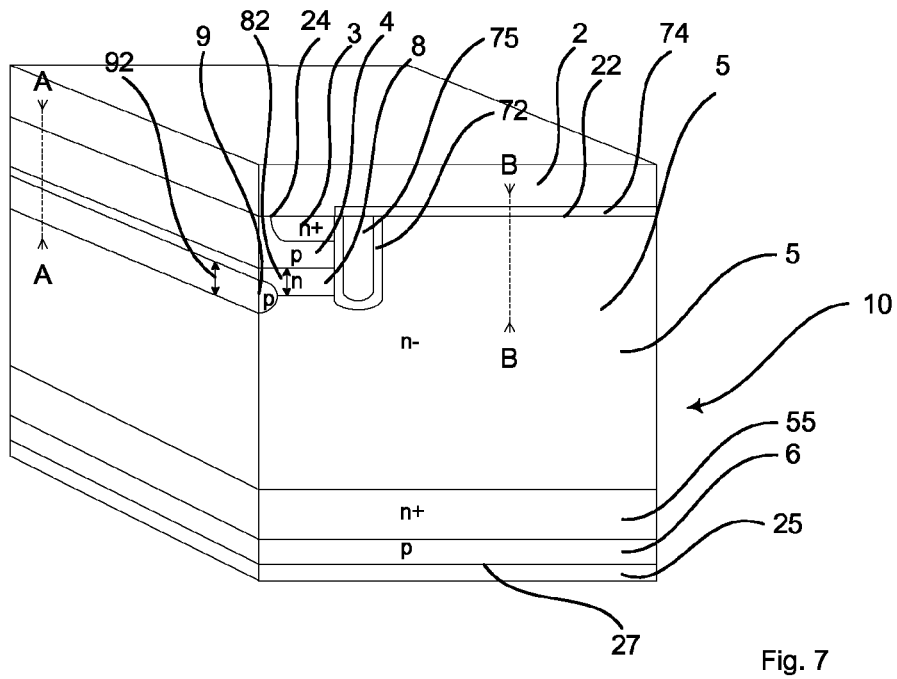
FIG. 7 shows an inventive insulated gate semiconductor device having a trench gate electrode according to an exemplary embodiment of the present disclosure.
Figure 10:
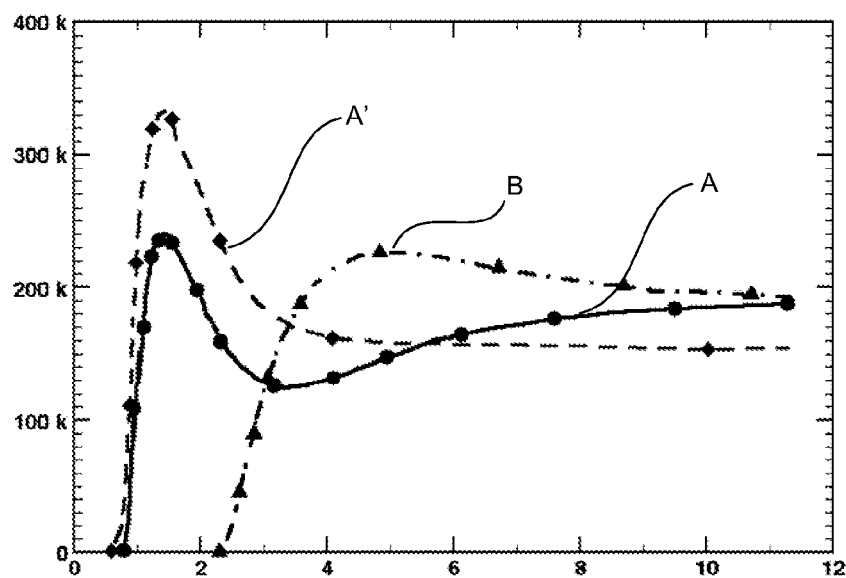
FIG. 10 shows the electrical field of a known IGBT and an inventive IGBT according to an exemplary embodiment of the present disclosure.

In FIG. 10 the electric field is shown as lines A and B, respectively relative to a line B-B for an inventive IGBT according to FIGS. 6 and 7, respectively. The electric field A' for a known device of FIG. 5 (line along A'-A') shows that the peak field can be efficiently reduced due to the presence of the compensation layer.

Figure 11:
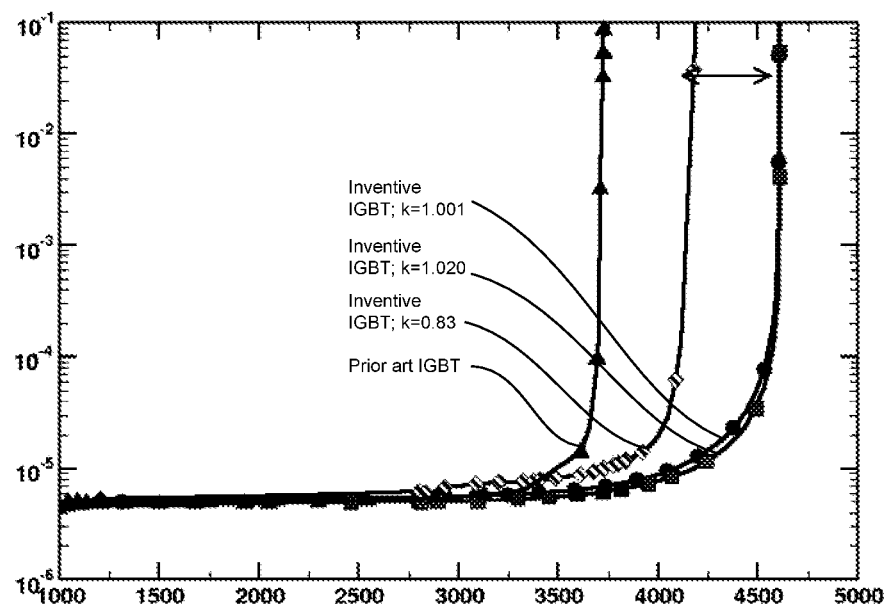
FIG. 11 shows the breakdown voltage of a known IGBT and an inventive IGBT according to an exemplary embodiment of the present disclosure.
Figure 12:
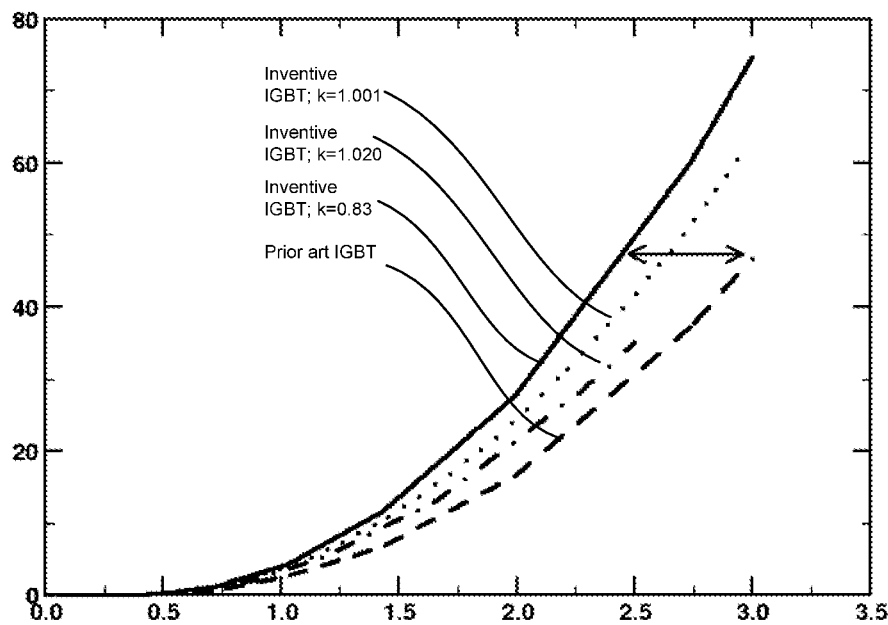
FIG. 12 shows the on state losses of a known IGBT and an inventive IGBT.

FIGS. 11 and 12 show the simulated performance improvement in breakdown voltage and on-state losses due to the charge compensated structure. It is shown that for a higher equivalence of the product of doping concentration and thickness of the enhancement layer and compensation layer the effects are improved.

The better the doping concentrations times thickness of the enhancement and compensation layer correspond, the better are the performance improvements. However, even with a structure with a compensation layer, the product of doping concentration and thickness can be 20% lower than the theoretical optimum and can yield significant improvement over known structures.

In FIG. 6 an inventive IGBT 1 is shown having an active cell with layers of different conductivity types in the following order between an emitter electrode 2 on an emitter side 22 and a collector electrode 25 on a collector side 27 opposite to the emitter side 22: an (n+) doped source region 3; a (p) doped base layer 4, which contacts the emitter electrode 2 in a contact area 24; an (n) doped enhancement layer 8 having a high doping concentration; a (p) doped compensation layer 9, which has a compensation layer thickness $t_p$ 92, which is a maximum thickness of the compensation layer 9 in a plane perpendicular to the emitter side 22; an (n−) doped drift layer 5 having lower doping concentration than the enhancement layer 8; and a (p) doped collector layer 6 of the second conductivity type.

The emitter electrode 2 can comprise the contact area 24, at which the emitter electrode 2 contacts the base layer 4 and the source region 3. The active semiconductor cell is formed within a wafer, which can comprise such layers or parts of such layers, which lie in orthogonal projection with respect to the emitter side 22 of the contact area 24, to which the source region 3 is in contact, the source region 3, and such part of the base layer 4, at which an electrically conductive channel, through which charge carriers can flow, can be formed. The active cell furthermore can comprise in projection to these layers or the described parts of these layers, part of the drift layer 5 and the collector layer 6. The wafer can be made of silicon or GaN or SiC.

Figure 8:
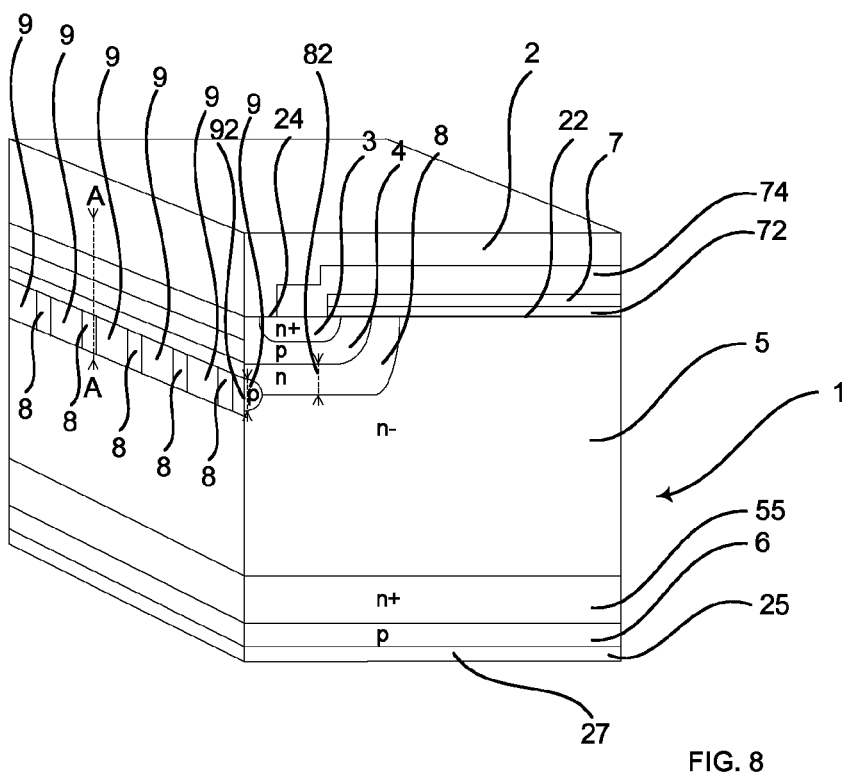
FIG. 8 shows another inventive insulated gate semiconductor device having a planar gate electrode according to an exemplary embodiment of the disclosure.

FIGS. 6 to 8 show the right hand part of an inventive semiconductor device. The device can include additionally another left hand part, which is the result of mirror-imaging of the right-hand part.

In FIG. 6, the device comprises a planar gate electrode 7 design. The planar gate electrode 7 is arranged on top of the emitter side 22 electrically insulated from the base layer 4, the source region 3 and the drift layer 5 by an insulating layer 72. For example, a further insulating layer 74 is arranged between the planar gate electrode 7 and the emitter electrode 2.

The compensation layer 9 is arranged in a projection of the contact area 24 between the enhancement layer 8 and the drift layer 5, such that a channel between the enhancement layer 8 and the drift layer 5 is maintained. The enhancement layer 8 and the drift layer 5 are thereby directly connected. The compensation layer 9 does not extend into an area outside the projection of the contact area 24. The compensation layer 9 is arranged such that the channel can be formed within the projection of the active cell. The compensation layer 9 on the other hand is floating; e.g., it is not connected to the base layer 4. In an exemplary embodiment, this connection between enhancement layer 8 and drift layer 5 is outside the projected area of the contact area 24.

In an exemplary embodiment, the compensation layer thickness $t_p$ 92 is arranged in the center of the contact area 24. It can be arranged such that the compensation layer 9 does not extend into an area outside the projection of the contact area 24.

The enhancement layer 8 is arranged between and thereby separates the drift layer 5 and the base layer 4. It has an enhancement layer thickness $t_n$ 82, which is measured as the maximum thickness of the enhancement layer within the projection of the contact area 24. The product of the doping concentration $N_n$ and thickness $t_n$ 82 of the enhancement layer corresponds to the product of the doping concentration $N_p$ and thickness $t_p$ 92 of the compensation layer, whereas a difference between these products corresponding to a factor k, wherein k is for example between 0.67 and 1.5, is allowed. The doping concentrations are to be understood as maximum doping concentrations of the layers. As noted, exemplary embodiments can be configured such that:

$N_p t_p = k N_n t_n$

In an exemplary embodiment, the factor k is between 0.8 and 1.2 or between 0.9 and 1.1 or even varying only between for example 0.95 and 1.05. In the FIGS. 11 and 12 it is shown that for a better equivalence of these products the breakdown voltage can be further improved and on-state losses further reduced.

In another exemplary embodiment, the compensation layer thickness 92 is for example between 0.1 and 10 μm, such as between 0.5 and 5 μm.

A buffer layer 55 of the first conductivity type having higher doping concentration than the drift layer 5 can be arranged between the drift layer 5 and the collector layer 6.

A maximum doping concentration of the enhancement layer $N_n$ can for example be as high as at least $1*10^{16}$ cm$^{-3}$. In an exemplary embodiment, the maximum doping concentration of the enhancement layer $N_n$ is at least for example $2*10^{16}$ cm$^{-3}$. The maximum doping concentration of the enhancement layer can be up to for example $1*10^{17}$ cm$^{-3}$, so that the doping concentration of the compensation layer can for example be as high as at least $0.67*10^{16}$ cm$^{-3}$, such as $1.34*10^{16}$ cm$^{-3}$ and up to $1.5*10^{17}$ cm$^{-3}$.

For example, the doping concentration of the enhancement layer is lower than of the source region. The doping concentration of the base layer and the compensation layer can be freely chosen due to the application specifications and the rules for the doping concentrations given above. For devices above 600 V the doping concentration of the drift layer is for example below $5*10^{14}$ cm$^{-3}$. The base layer has an exemplary doping concentration below $2*10^{18}$ cm$^{-3}$.

Alternatively to planar gate electrode 7 designs as shown in FIG. 6, the IGBT can comprise trench electrode designs as shown in FIG. 7, in which a trench gate electrode 75 is electrically insulated from the base layer 4, the source region 3 and the drift layer 5 by an insulating layer 72. The trench gate electrode 75 is arranged in the same plane (which plane is arranged parallel to the emitter side 22) and lateral to the base layer 4 and extends deeper into the drift layer 5 than the base layer 4. For example, a further insulating layer 74 is arranged between the gate electrode 75 and the emitter electrode 2.

Figure 4:
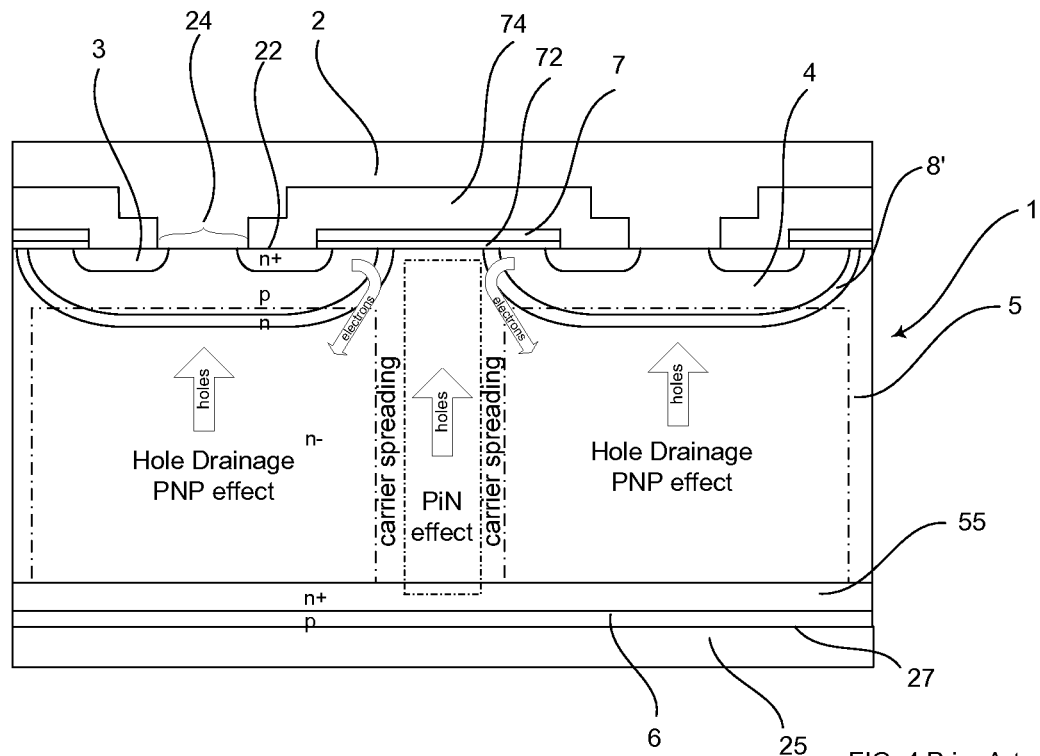
FIG. 4 shows electrical effects in a known insulated gate semiconductor device according to FIG. 2.

The IGBT device can comprise only one active cell as already disclosed, but it is also possible that the device comprises at least two or more such active cells. This can result in devices in case of planar gate electrodes similar to the known device as shown in FIG. 4, but with the addition of the inventive compensation layers 9 in the projection of the contact area 24.

FIG. 8 shows another exemplary inventive embodiment, in which the enhancement layer 8 comprises in a first depth a continuous part and in a second depth, which is greater than the first depth, another part, in which the enhancement layer 8 alternates with the compensation layer 9, so that the enhancement layer 8 is comb-shaped with the teeth of the comb directed towards the collector side 27. The first and second depth are measured as distances from the emitter side 22. For example, the layers alternate in such a direction, which is perpendicular to the direction, in which the source region 3 connects the emitter electrode 2 and the gate electrode 7.

These examples shall not be construed to limit the scope of the disclosure. The disclosed designs and arrangements are just examples of kinds of possible designs and arrangements for the base layer(s) and well (zones).

In another exemplary embodiment, the conductivity types are switched; e.g., all layers of the first conductivity type are (p) type (e.g. the drift layer 5, the source region 3) and all layers of the second conductivity type are (n) type (e.g. base layer 4, the collector layer).

It should be noted that the term "comprising" does not exclude other elements or steps and that the indefinite article "a" or "an" does not exclude the plural. Also elements described in association with different embodiments can be combined. It should also be noted that reference signs in the claims shall not be construed as limiting the scope of the claims.

It will be appreciated by those skilled in the art that the present disclosure can be embodied in other specific forms without departing from the spirit or essential characteristics thereof. The presently disclosed embodiments are therefore considered in all respects to be illustrative and not restricted. The scope of the disclosure is indicated by the appended claims rather than the foregoing description and all changes that come within the meaning and range and equivalence thereof are intended to be embraced therein.

For manufacturing the structure of an incentive IGBT on the emitter side 22, a first mask can, for example, be applied on the emitter side 22 with an opening, through which particles are applied (e.g. by implantation) in order to create the compensation layer 9. Afterwards, another mask can be applied, which has a larger opening than the first mask, through which mask the particles for the (n) doped enhancement layer are applied, after which the particles for the (p) doped base layer and then the particles for the source region are applied. Diffusion steps can be used to drive the particles into the wafer.

The layers on the collector side 27 of the device and the gate electrode can be formed by methods well known to those skilled in the art, and after the layers have been created in the wafer, the electrodes 2, 25 can be applied as metal layers on the wafer.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE LIST

1 Inventive IGBT
10 Prior art IGBT
2 emitter electrode
22 emitter side
24 contact area
25 collector electrode
27 collector side
3 source region
4 base layer
5 drift layer
55 buffer layer
6 collector layer
7 trench gate electrode
75 planar gate electrode
8 enhancement layer
8' enhancement layer of a prior art device
82 enhancement layer thickness $t_n$
9 compensation layer
92 compensation layer thickness $t_p$

What is claimed is:

1. An insulated gate bipolar device with a gate electrode, the gate electrode being arranged on an emitter side, which device comprises:
an active cell with layers of different conductivity types in an order between an emitter electrode on the emitter side and a collector electrode on a collector side opposite to the emitter side as follows:
a source region of a first conductivity type;
a base layer of a second conductivity type, which contacts the emitter electrode in a contact area;
an enhancement layer of the first conductivity type having high doping concentration;
a compensation layer of the second conductivity type arranged between the enhancement layer and a drift layer, which has a compensation layer thickness $t_p$, which is a maximum thickness of the compensation layer in a plane perpendicular to the emitter side;
the drift layer of the first conductivity type having lower doping concentration than the enhancement layer, wherein the enhancement layer separates the base layer from the drift layer; and
a collector layer of the second conductivity type;
wherein the compensation layer is arranged in a projection of the contact area between the enhancement layer and the drift layer, such that a channel between the enhancement layer and the drift layer is maintained;
wherein the compensation layer floats relative to the base layer such that the compensation layer does not extend into an area outside the projection of the contact area; and
wherein the enhancement layer has an enhancement layer thickness $t_n$, which is measured in a same plane as the compensation layer thickness, with:

$$N_p t_p = k N_n t_n,$$

wherein $N_n$ is a doping concentration of the enhancement layer;
wherein $N_p$ is the doping concentration of the compensation layer; and
wherein k is a factor between 0.67 and 1.5.

2. The bipolar device according to claim 1, comprising:
a buffer layer of the first conductivity type having higher doping concentration than the drift layer, which buffer layer is arranged between the drift layer and the collector layer.

3. The bipolar device according to claim 1, wherein a maximum doping concentration of the enhancement layer is at least $1*10^{16}$ cm$^{-3}$.

4. The bipolar device according to claim 1, wherein a maximum doping concentration of the enhancement layer is at least $2*10^{16}$ cm$^{-3}$.

5. The bipolar device according to claim 1, wherein a maximum doping concentration of the enhancement layer is $1*10^{17}$ cm$^{-3}$.

6. The bipolar device according to claim 1, wherein compensation layer thickness is between 0.1 and 10 μm.

7. The bipolar device according to claim 1, wherein k is between 0.8 and 1.2.

8. The bipolar device according to claim 1, wherein k is between 0.9 and 1.1.

9. The bipolar device according to claim 1, wherein k is between 0.95 and 1.05.

10. The bipolar device according to claim 1, wherein the gate electrode is one of a trench gate electrode and a planar gate electrode.

11. The bipolar device according to claim 1, wherein the compensation layer does not extend into an area outside the projection of the contact area.

12. The bipolar device according to claim 1, wherein the bipolar device comprises: at least two active cells.

13. The bipolar device according to claim 1, wherein the compensation layer thickness $t_p$ is arranged in a center of the contact area.

14. The bipolar device according to claim 1, wherein the bipolar device is formed on a wafer made of silicon or GaN or SiC.

15. The bipolar device according to claim 1, wherein the enhancement layer comprises:

in a first depth a continuous part and in a second depth, which is greater than the first depth, another part, in which the enhancement layer alternates with the compensation layer, the first and second depths being measured from the emitter side.

16. The bipolar device according to claim 1, wherein compensation layer thickness is between 0.5 and 5 μm.

17. The bipolar device according to claim 2, wherein a maximum doping concentration of the enhancement layer is at least $1*10^{16}$ cm$^{-3}$.

18. The bipolar device according to claim 17, wherein a maximum doping concentration of the enhancement layer is at least $2*10^{16}$ cm$^{-3}$.

19. The bipolar device according to claim 18, wherein a maximum doping concentration of the enhancement layer is $1*10^{17}$ cm$^{-3}$.

20. The bipolar device according to claim 19, wherein compensation layer thickness is between 0.1 and 10 μm.

* * * * *